United States Patent
Lombardi et al.

(10) Patent No.: US 7,001,491 B2
(45) Date of Patent: Feb. 21, 2006

(54) VACUUM-PROCESSING CHAMBER-SHIELD AND MULTI-CHAMBER PUMPING METHOD

(75) Inventors: Michael J. Lombardi, Phoenix, AZ (US); Glyn J. Reynolds, Las Vegas, NV (US); Robert F. Foster, Mesa, AZ (US); Robert C. Rowan, Jr., Phoenix, AZ (US); Frederick T. Turner, Sunnyvale, CA (US)

(73) Assignee: Tokyo Electron Limited, Tokyo (JP)

( * ) Notice: Subject to any disclaimer, the term of this patent is extended or adjusted under 35 U.S.C. 154(b) by 222 days.

(21) Appl. No.: 10/607,141

(22) Filed: Jun. 26, 2003

(65) Prior Publication Data

US 2004/0262155 A1    Dec. 30, 2004

(51) Int. Cl.
*C23C 14/00*    (2006.01)
(52) U.S. Cl. .............................. 204/192.12; 204/192.1; 204/298.11; 137/1; 137/14; 427/569; 118/715; 118/504
(58) Field of Classification Search ............. 204/192.1, 204/192.12, 298.11; 118/715, 504; 137/1, 137/14; 438/698, 758; 216/58, 63, 67; 427/569, 427/598, 294
See application file for complete search history.

(56) References Cited

U.S. PATENT DOCUMENTS

| | | | |
|---|---|---|---|
| 4,548,699 A | | 10/1985 | Hutchinson et al. |
| 4,756,815 A | * | 7/1988 | Turner et al. ........... 204/298.25 |
| 4,915,564 A | | 4/1990 | Eror et al. |
| 5,024,747 A | * | 6/1991 | Turner et al. .......... 204/298.09 |
| 5,065,698 A | * | 11/1991 | Koike ......................... 118/719 |
| 5,167,789 A | * | 12/1992 | Latz ....................... 204/298.11 |
| 5,215,619 A | * | 6/1993 | Cheng et al. ........... 156/345.42 |
| 5,281,320 A | * | 1/1994 | Turner et al. ........... 204/298.15 |
| 5,470,451 A | * | 11/1995 | Kobayashi et al. ..... 204/298.03 |
| 5,538,603 A | * | 7/1996 | Guo ........................ 204/192.12 |
| 5,690,795 A | * | 11/1997 | Rosenstein et al. ...... 204/192.1 |
| 5,736,021 A | * | 4/1998 | Ding et al. ............. 204/298.11 |
| 5,879,523 A | * | 3/1999 | Wang et al. ............ 204/298.11 |
| 5,964,947 A | * | 10/1999 | Zhao et al. .................. 118/715 |
| 6,022,461 A | * | 2/2000 | Kobayashi et al. ..... 204/298.07 |
| 6,176,981 B1 | * | 1/2001 | Hong et al. ............. 204/192.15 |
| 6,296,747 B1 | * | 10/2001 | Tanaka ................... 204/298.07 |

(Continued)

FOREIGN PATENT DOCUMENTS

JP    2000-239825    *    9/2000

*Primary Examiner*—Jeffrie R. Lund
(74) *Attorney, Agent, or Firm*—Wood, Herron & Evans, L.L.P.

(57) ABSTRACT

One or more chambers of a multi-chamber vacuum processing apparatus are provided with a high gas flow conductance path to an exhaust volume of the apparatus that is maintained at high vacuum with a high vacuum pump. Separate pumps for the one or more chambers are made unnecessary by providing such chambers with a protective deposition shield or shield set that is configured to substantially protect walls of the chamber and the gas flow conductance path from deposition and to partially impede the gas flow from the chamber through the gas flow conductance path to the exhaust volume so that the chamber can be operated at a higher pressure than that of the exhaust volume and the chambers can be operated at different pressures and without cross-contamination. Preferably, a nested set of chamber shields is used. A controller is programmed to control the processing of wafers in the chambers by controlling the supply of process gas into the chambers.

16 Claims, 4 Drawing Sheets

U.S. PATENT DOCUMENTS

| | | | |
|---|---|---|---|
| 6,475,353 B1 * | 11/2002 | Lantsman | 204/192.12 |
| 6,521,105 B1 * | 2/2003 | Tani et al. | 204/298.06 |
| 6,645,357 B1 * | 11/2003 | Powell | 204/298.11 |
| 6,719,886 B1 * | 4/2004 | Drewery et al. | 204/298.18 |
| 6,730,174 B1 * | 5/2004 | Liu et al. | 118/715 |
| 6,837,974 B1 * | 1/2005 | Lawson et al. | 204/298.11 |
| 2002/0144657 A1 * | 10/2002 | Chiang et al. | 118/723 E |
| 2003/0209422 A1 * | 11/2003 | Wang et al. | 204/192.12 |
| 2004/0025788 A1 * | 2/2004 | Ogasawara et al. | 118/715 |
| 2004/0262155 A1 * | 12/2004 | Lombardi et al. | 204/298.01 |

* cited by examiner

VACUUM-PROCESSING CHAMBER-SHIELD AND MULTI-CHAMBER PUMPING METHOD

This application relates to vacuum processes such as physical vapor deposition processes, and particularly to single wafer processing modules that may be used for coating semiconductor wafers. The application particularly relates to the shielding of processing chamber surfaces and to the maintenance and control of the vacuum and gas flow in vacuum processing chambers.

BACKGROUND OF THE INVENTION

A typical physical vapor deposition (PVD) apparatus includes a processing chamber, a cathode assembly and a substrate support within the chamber, a vacuum system to maintain the pressure in the chamber below 100 mTorr and a gas supply system to introduce a sputtering gas into the chamber. The cathode assembly includes a target, insulators to electrically isolate that target from the chamber wall, a power supply to energize the target, and a magnetron magnet assembly to form a plasma confining magnetic field close to the target surface. When the substrates being processed by the PVD apparatus are silicon wafers for integrated circuit manufacturing, the most commonly encountered PVD apparatus vacuum systems use high-vacuum cryogenic pumps and several pressure gauges.

Because sputtered material is ejected from the target in all directions in the processing chamber of a PVD apparatus, the whole chamber, not just the substrate, is exposed to coating material from the target. Standard practice has been to place physical barriers known as shields inside the chamber so as to prevent unwanted deposition on the chamber walls and on various other components inside the chamber. For example, shields may be used to protect the dielectric insulator that electrically isolates the target from the usually grounded metal chamber walls. Shields used to protect chamber components usually have their surfaces roughened so that material that is deposited onto the shields adheres better to the shields and does not spall as it increases in thickness. If the deposited material does not adhere well to the shields, it can flake off, causing particles that can land on the substrate. In integrated circuit manufacturing, these particles can destroy sensitive devices on the substrate surface. Usually these shields must be changed on a regular preventive maintenance schedule. Otherwise the accumulated deposits will become too thick and stresses will build up that cause the shields to shed particles.

For some sensitive applications, a process chamber must be capable of being evacuated to an ultra-high vacuum (below $10^{-8}$ Torr), and the sputtering gas must be purified before it is introduced into the process chamber. The equipment required to achieve these conditions is very expensive. In other semiconductor PVD applications, such equipment is not required. Some less critical PVD applications used for integrated circuit manufacture are extremely sensitive to cost, and call for equipment having a minimum of expensive components. Some of the most expensive components of a PVD chamber are those required to achieve ultra-high vacuum (UHV).

For silicon wafer processing, the process chamber is most commonly pumped by a dedicated high vacuum pump, usually a turbo-molecular or cryopump. However, there are low cost PVD systems such as the Ulvac SRH-820 and the Sputtered Films, Inc. (SFI) ENDEAVOR, that use a single, common, centrally located high vacuum pump to evacuate all PVD process chambers. The lower cost systems that may be used for less critical applications can achieve such pumping with less concern for chamber cross-contamination or interference.

High end, single wafer, PVD tools such as the Tokyo Electron Limited ECLIPSE Series, the Applied Materials ENDURA and the Novellus INOVA, for example, are usually considered too expensive for dedication to low end foundry packaging applications. Many foundries are able to use inexpensive, relatively inferior and lower throughput batch tools for their less critical PVD applications.

Single wafer tools have several advantages over batch machines for silicon wafer processing. Single wafer systems lend themselves readily to statistical process control, since every wafer experiences the same process in the same position in a given process chamber. Also, in the event of wafer breakage, usually all the wafers in a batch will be scrap due to the particles generated when a wafer breaks; in a single wafer system, only the wafer that breaks would be lost. A single wafer tool usually has a higher throughput for larger wafer sizes. As wafer size increases, the number of wafers in a batch must decrease correspondingly. Consequently, there are compelling reasons for current users of inexpensive batch tools to convert to single wafer machines, provided that they are sufficiently inexpensive.

One such inexpensive single wafer tool is the Varian 3180 series tool. This tool is a cassette-to-cassette single wafer PVD tool, where sputtering takes place in a large plenum with four sputtering stations. Features of this machine are described in U.S. Pat. Nos. 4,548,699 and 4,716,815. Each station of this tool is directly opposed to a sputtering target. The wafers rotate sequentially from a first station to a last, and may be subjected to a sputter coating or other process at each of the stations. The plenum is pumped by a single cryopump. One disadvantage to this arrangement has been that all sputtering processes take place in a common ambient, at the same pressure. It is often desirable to sputter different metals in a stack at different pressures, for example, to optimize film stress, but this has not been possible with this kind of common plenum machine. Also, in many of such machines, there has been no easy way to isolate the sputtering ambient of the various chambers. In the event that a metal stack requires reactive sputtering, for example, using a mixture of argon and nitrogen to deposit titanium nitride, the processes in adjacent chambers could be contaminated by nitrogen.

Accordingly, there remains a need for a better way to use a common vacuum pumping system in a multiple-chamber single-wafer tool.

SUMMARY OF THE INVENTION

A primary objective of the present invention is to allow a PVD system with multiple process chambers that are usually each pumped by a dedicated high vacuum pump on each process chamber, to instead be pumped by a single pump located remotely from the process chambers.

According to principles of the present invention, a multiple single-wafer process chamber apparatus is provided with a high vacuum pump connected to the apparatus via a plenum, a transfer chamber or other exhaust volume remote from the chambers. A gas flow conductance path is provided from one or more of the chambers to the exhaust volume. One or more of such process chambers is provided with a set of one or more shields that gives line-of-sight protection from deposition for critical components in the process chamber, while allowing adequate vacuum conductance from the chamber through the path to the high vacuum pump. The shield set for that chamber is configured in such a way that the gas conductance to the exhaust volume provides a pressure drop that allows the chamber to be operated at a desired processing pressure with the pressure of the exhaust volume maintained sufficiently below the processing pressures of all of the chambers to sustain the flow of gas from the chambers toward the exhaust volume. The determination of shield configuration is accompanied by establishment of a gas flow rate into the chamber so that the pressure objectives are satisfied.

Where more than one or all of the chambers of the apparatus are provided with such shields, one or more of the chambers can be operated at a pressure that is significantly higher than that of the exhaust volume, and the operating pressures of different chambers can be different and controlled by a programmed controller. With the pressure of each chamber higher than that of the exhaust volume, cross contamination among the chambers is reduced significantly so different gases and processes can be used in the different chambers.

This may be accomplished, for example, by selecting a shield set design for the chamber with the highest processing pressure to provide a relatively low gas conductance to the exhaust volume. The conductance is chosen that will allow the exhaust volume to maintain a relatively low pressure that is sufficiently below that of all of the chambers. The gas flow rate into this high pressure chamber can be adjusted to optimize the processing pressure in that chamber. Then the lower pressure chambers are provided with high conductance shield sets that allow those chambers to operate at their respectively lower pressures, with the gas flow rates into those chambers also being adjusted to optimize those pressures.

Typically, two shield sets may be used, one with relatively low gas conductance for the higher pressure chambers and one set with relatively high gas conductance for the lower pressure chambers. Differences in processing pressures among the lower (or higher) pressure chambers can be adjusted by varying the flow rates of processing gas injected into those chambers. Maintaining sufficiently low pressure into the exhaust volume must take into account the gases being exhausted into it from all of the chambers.

The sets of shields for a PVD system are designed to provide coverage of the chamber walls and other critical components that need to be protected from deposition, yet provide a gas conductance path to a vacuum pump connected to the exhaust volume that is located remotely from the PVD chamber.

The configuration of the conductance paths depends on the apparatus platform architecture. The pumping path can be through a plenum wall to a common plenum such as exists in the Tokyo Electron Limited ECLIPSE Series. The pumping path can alternatively be through a slot in the chamber wall that opens into a central transfer chamber such as exists in a traditional cluster tool.

The processing pressure in a chamber equipped with a shield or shield set according to the present invention is a pressure that is distinctly higher than that of the exhaust volume. The chamber is maintained at this distinctly higher pressure by the presence of a chamber shield to impede the flow of gas from the chamber to the exhaust volume to the degree that causes a pressure differential that produces the distinctly higher pressure. As used herein, "distinctly higher" pressure is a pressure that is adequate for performance of the process, where the pressure in the exhaust volume is low enough to insure that there is gas flow from the chamber to the exhaust volume, typically of a few standard cubic centimeters per minute (sccm).

Although two embodiments are specifically described herein, one that applies to machines such as those of the Tokyo Electron ECLIPSE type, and the other that applies to the tools of the generic cluster tool type, those skilled in the art will appreciate how to use the general principles described herein for other types of equipment. Such equipment may be used for processing silicon wafers, or for other substrates, for example, magnetic disks.

The present invention saves costs by reducing the number of expensive high-vacuum pumps. In addition, additional savings arise from the elimination of gate valves, reducing gauging, eliminating certain regeneration gas and pump out lines in the case of cryopumps, and eliminating certain fore-lines and backing pumps in the case of turbo-molecular pumps.

The invention allows the use of a single high-vacuum pump to evacuate and maintain process pressure in a single-wafer PVD tool comprised of several different process stations. This is achieved without compromising shielding of critical surfaces within the tool. The nature of the shields, particularly the nested shields of certain embodiments, allows the conductance between the process station and vacuum pump to be carefully controlled, thus allowing different process pressures in adjacent processing chambers. Furthermore, in a tool design based upon a Tokyo Electron Limited ECLIPSE or a standard cluster tool, the shields can easily be replaced with a conventional set of shields suitable for operating the chambers with separate pumps. High vacuum pumps and isolation valves can then be added to one or more of the process stations so that reactive sputtering processes can then be run without major changes to the tool architecture. This provides flexibility not possible with machines of the prior art. All the other advantages of a single wafer PVD tool are retained.

These and other objectives and advantages of the present invention will be readily apparent from the following detailed description of the drawings.

DETAILED DESCRIPTION OF THE DRAWINGS

Figure 1:
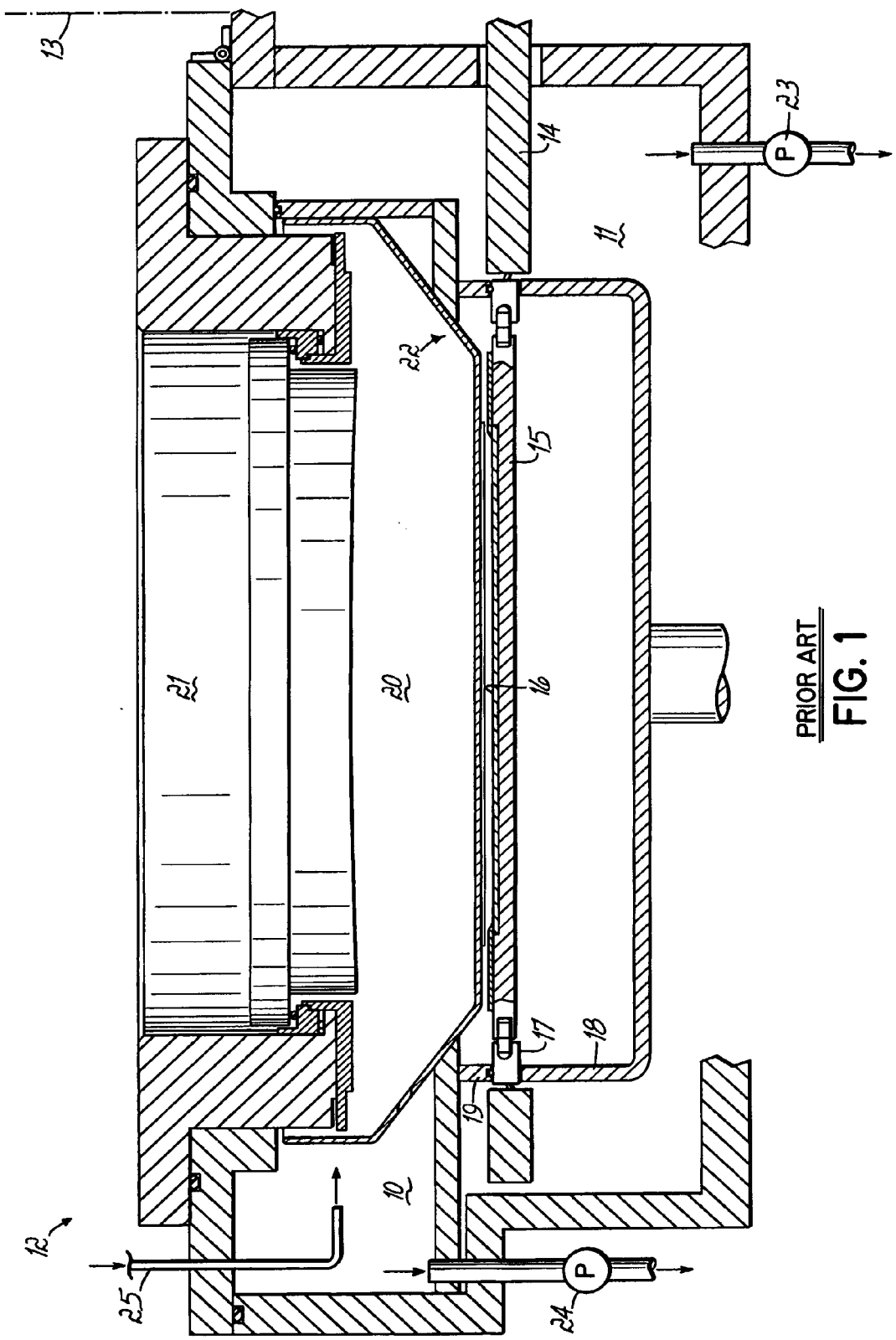
FIG. 1 is a cross-sectional view of one of the chambers of a multi-chamber single-wafer PVD apparatus of the prior art.

FIG. 1 is a cross-sectional view through a PVD processing chamber or pod 10 of a processing apparatus 12. The apparatus 12 is a semiconductor wafer processing machine of the type described in U.S. Pat. Nos. 4,909,695; 4,915,564 and 5,516,732, each hereby expressly incorporated herein by reference. Machines of this type are marketed under the trademarks ECLIPSE, ECLIPSE MARK II, ECLIPSE STAR and ECLIPSE MARK IV by Applicant's assignee, Tokyo Electron Limited.

In the apparatus 12, five process stations, one of which is the pod 10, are situated at equal intervals, spaced 72° apart around a central axis 13. Typically, and in the ECLIPSE-type machines referred to above, the axis 13 is horizontal. An index plate 14 is enclosed in a plenum 11 in which it is mounted to rotate in a vertical plane on the axis 13 to carry five wafer holders 15, each also spaced at equal 72° intervals around the axis 13. Each wafer holder 15 is capable of holding a single semiconductor wafer 16 therein for processing. Rotation of the index plate 14 indexes the wafer holders 15 through each of the pods 10 to perform sequential processes on each of the wafers 16. Each of the wafer holders 15 is supported in an opening in the index plate 14 by a sealing ring 17. When a wafer holder 15 is positioned in a pod 10 for processing, a moveable cup-shaped chamber wall 18 clamps the sealing ring 17 against a wall 19 of the plenum 11 to form a sealed processing chamber 20 within the pod 10.

When the processing chamber 20 is sealed, the wafer 16 is supported so as to face a sputtering target and cathode assembly 21 for the performance of a PVD process on the wafer 16. A chamber shield 22 is fixed to the plenum wall 19 to shield the walls of the chamber 10 during the PVD process. A vacuum pump 23 is connected to the plenum 11 to pump the plenum 11 to a high vacuum, which also evacuates the pods 10 when the chambers 20 are open to the plenum 11. Each of the pods 10 is itself equipped with a vacuum pump 24 to pump the respective chamber 20 to a vacuum level as required for the process being performed in the pod 10. Each pod has a gas inlet line 25 for introducing processing gas into the chamber 20. The flow rate of processing gas into the inlet 25 is set by setting the set point of a mass flow controller (not shown) and a throttle valve (not shown) at the pump 24 is controlled to maintain an appropriate pressure and gas flow rate in the chamber 20.

Figure 2:
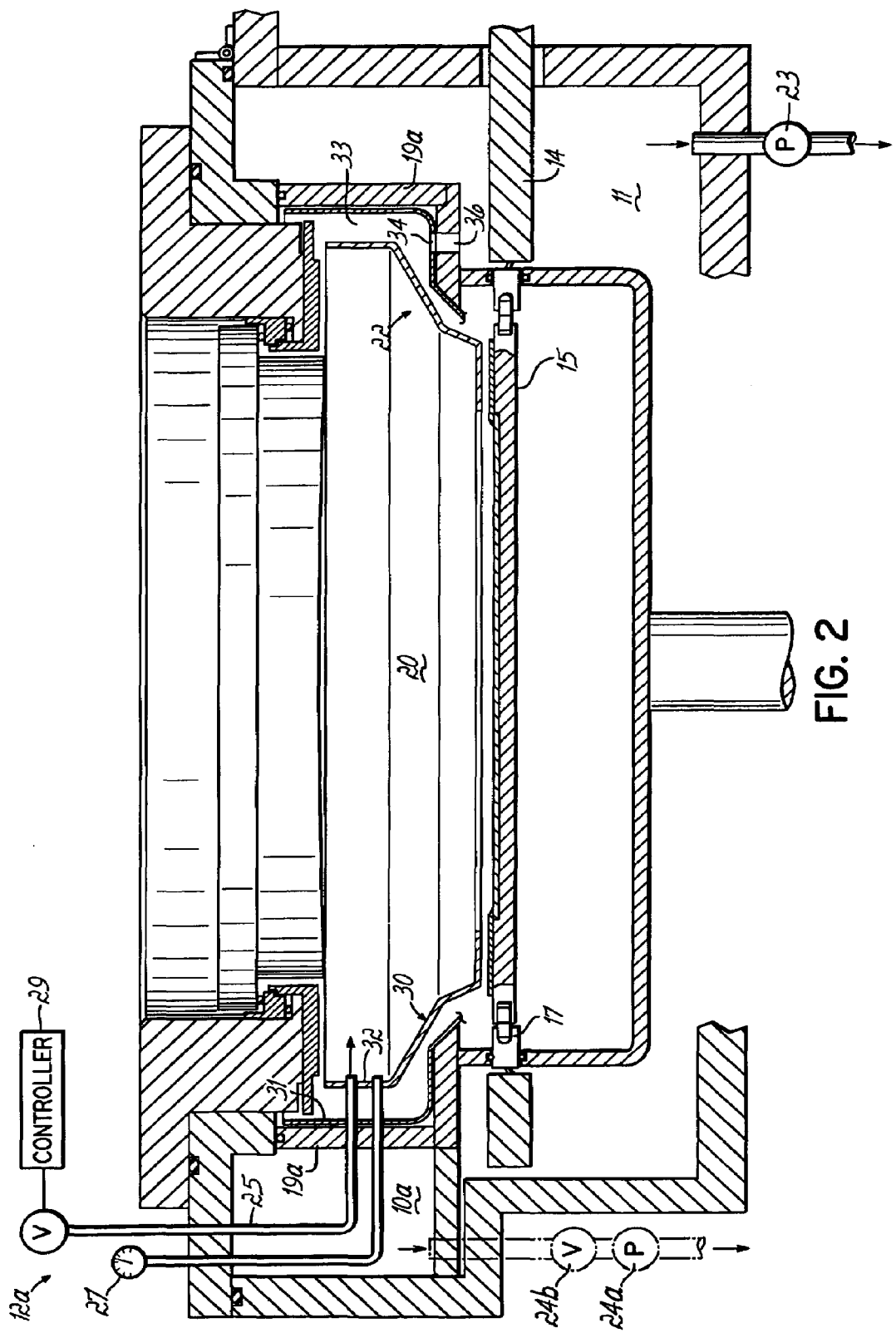
FIG. 2 is a cross-sectional view of a nested chamber shield installed in the apparatus of FIG. 1 according to one embodiment of the present invention.

FIG. 2 is a diagrammatic cross section showing one manner in which the apparatus 12 of FIG. 1 can be modified according to the present invention. In FIG. 2, such a modified apparatus 12a is provided in which a set 30 of nested shields is provided in place of the shield 22 in the deposition chamber 20 of FIG. 1. The set 30 includes an outer shield 31, which is configured to conform closely to the pod and plenum wall 19a, and an inner shield 32. The shields 31 and 32 are nested with an annular space or gap 33 maintained between them. The outer shield 31 may be supported on the chamber wall 19a and the inner shield 32 may be mounted on standoffs (not shown) from the outer shield 31 or on alternative structure supported by the chamber wall 19a.

A set of one or more slots 34 is cut in the outer shield in communication with the annular space 33. The shields 31 and 32 are dimensioned to fit into a modified deposition pod 10a of a tool 12 of the Eclipse type, with the pod 10 modified with a set of slots 36 formed in the plenum wall 19a. The slots 36 align with the slots 34 in the outer shield 31 so that pumping for the deposition pod 10 is effected through the series of circumferential slots 34 and 36, which may be, for example, about one inch wide, machined into the wall 19a of the plenum 11 and extending about half way around the circumference of the chamber to communicate with the vacuum within the plenum 11. This dimension is nominal, and can be smaller or larger, depending on the gas flow conductance desired, as explained below. Examples of slot cross-sectional area are 25 square inches, 50 square inches, or such other larger or smaller areas that are effective to provide the gas conductance needed to satisfy pressure criteria as explained herein.

The outer shield 31 is essentially a "skin," which fits inside the pod 10a and may conform to or be spaced closely from the chamber walls 19a. The shield 31 primarily protects all internal surfaces of the plenum 11 from unwanted deposition. This outer shield 31 is positioned in the chamber 20 with its slots 34 in alignment with the pumping slots 36 machined into the plenum wall 19a. The inner shield 32 covers these slots, and extends sufficiently far up the side of the pod 10a so as to require at least three specular reflections off shield surfaces before metal atoms from the target can deposit onto the exposed surface of the slots 36 in the plenum wall 19a. The slots 34 and 36 allow the pump 23 to be used to maintain a vacuum in the chamber 20, rather than requiring a dedicated pump such as pump 24 for the chamber 20.

The spacing 33 between inner shield 32 and outer shield 31 may be maximized as far as the pod and cathode geometry allow. Nonetheless, the gas flow conductance between the chamber 20 and the vacuum pump that pumps the chamber is reduced significantly by the shield set 30 compared to a normal Eclipse set up. The pumping speed and the reduction thereof, in liters per second (l/s), is gas dependent, as illustrated in Table I:

TABLE I

PUMPING VIA PLENUM WITH NESTED SHIELDS

|  | Ar | $N_2$ | $H_2O$ | $H_2$ |
| --- | --- | --- | --- | --- |
| $S_{cryo}$ | 1,200 | 1,500 | 4,000 | 2,500 |
| $U_{cryo}$ | 3,175 | 3,795 | 4,733 | 14,200 |
| $C_{valve}$ | 2,278 | 2,723 | 3,396 | 10,189 |
| $S_{net\ cryo-to-plenum}$ | 1,045 | 1,298 | 3,001 | 2,338 |
| $C_{nested\ shield}$ | 280 | 335 | 418 | 1,253 |
| $S_{plenum\ pump}$ @ process pod (estimate) | 221 | 265 | 357 | 816 |
| Ratio $S_{pod}/S_{plenum}$ | 3.54 | 3.61 | 4.96 | 2.21 |

In Table I, S denotes the pumping speed, U the aperture conductance, and C the vacuum conductance in molecular flow, respectively. The last row, ratio $S_{pod}/S_{plenum}$, compares the pumping speed of a typical apparatus 12 of the ECLIPSE configuration, where the process pod is pumped by a dedicated cryopump connected to the pod through a gate valve, to that obtained when the process pod is pumped with the plenum cryopump through a set of nested shields as proposed here. The values in the table are appropriate where the inside diameter of the pod or chamber is about 14 inches, with the outer shield 31 having a nominal outside diameter of about 14 inches, the diameter of the inner shield 32 being about 12 inches, leaving the width of the gap 33 about one inch.

The net result of using the shield set 30 in the arrangement detailed in FIG. 2 is to reduce the pumping speed of a typical 1200 l/s (liter per second) cryopump to between 200 and 300 l/s for argon. This is typical of cryopumps equipped with sputter plates, which are metal plates with a series of holes that are heat-sunk to the first stage of the cryopump and provide a reduction in permanent gas pumping speed, while maintaining full water pumping speed. Many PVD tool manufacturers use sputter plates to increase the time between cryopump regenerations, which must occur when argon ice builds up inside the pump.

The water pumping speed for the pod 10a of an ECLIPSE type apparatus 12a that is equipped with a shield set 30, and using the plenum pump 23 to pump the chamber 20, will be reduced substantially compared to a machine using a separate pump 24 for the chamber 20. While this might not be suitable for some applications, for many packaging applications this will be an acceptable and economical system.

To test the effect of reduced water pumping speed on the properties of a typical UBM stack, a tri-layer stack Cr/CrCu/Cu was deposited with the pod cryopump throttled so as to simulate the pumping speed which would result from pumping through the plenum. The properties of each individual film and the overall stack were monitored over 100 wafer depositions, and compared to the controls (films that were deposited with the regular pod pumping speeds). No discernible differences were observed. The vacuum conditions of many of the batch tools used to deposit under-bump-metal (UBM) films are much worse than those observed in pods 10 of the ECLIPSE type with heavily throttled cryopumps.

The use of nested shield sets 30 in combination with a single cryopump in a common location, such as pump 23 connected to the plenum 11, but with separate control of individual process gas injection points 25 in each of the individual process pods by a programmed controller 29, allows different process pressures in various pods 10a to result with a single pump 23. The process gas injection into the chambers 20 is controlled by setting the pressure on a mass flow controller, which may be provided with a feedback loop to maintain the pressure setting. In this way, films can be deposited under optimum pressure conditions often not practical in batch tools or in the Varian 3180 series. This requires process pressure control of the gas inlets 25 of each of the process pods 10. Each of the gas inlets 25 includes an inlet tube that extends from a gas source (not shown) outside of the chamber, through the chamber wall and through holes in the shields 31 and 32 into the processing space adjacent the wafer, as shown in FIG. 2. A pressure sensor 27 is similarly connected through a tube through holes in the shields 31,32 to sense the pressure directly from this processing space.

The operation of pods 10a attached to a common pump 23 at different pod pressures could lead to possible "cross-talk" between pods 10a, where gas back-streams from the plenum 11 to one of the process pods 10a, which could occur when one or more of the common pods 10 operates at significantly higher pressures than the other pods. To reduce the possibility of this potential problem, different sets 30 of shields 31 and 32 are provided for the pods 10a for processes that operate at higher pressures than for processes that operate at much lower pressures. Such shield sets 30 would be designed to have less gas flow conductance for higher pressure processes than the nested shield sets 30 for low pressure processes. The conductance could be reduced for pods 10a used for higher pressure processes either by reducing the annular gap 33 between inner shield 32 and outer shield 31 or by reducing the width of the slots 34 in the outer shield 31 to be less than the slots 36 in the plenum wall 19a. Of these two approaches, reducing the width of the slots 34 has the advantage of allowing the use of the same inner shield 32 for both high and low pressure processes, thereby keeping the process environment similar for all processes, and thereby reducing the occurrence of subtle effects that might arise if the inner shield dimensions were different for high and low pressure processes.

The process pressure threshold for using the low conductance shield set may be determined empirically, as could the exact shield geometry. By using the low conductance shield set, less process gas would be required to sustain the appropriate process pressure, thus avoiding any unnecessary pressure rise in the plenum 11. This, in turn, reduces the potential for back-streaming into those process pods operating at lower pressures. Because lower conductance shield sets reduce the effective pumping speed of the process pods equipped with the low conductance nested shield sets, tests are used to ascertain which films, if any, are sensitive to further reductions in effective pumping speed.

A set of shields may be provided that completely close off the pumping slots 36 machined into the plenum wall 19a. Then equipping that pod only with a separate cryopump 24a and isolation valve 24b would enable the particular pod to be used for reactive sputtering without risk of contamination of the adjacent sputtering processes. The implementation of the nested shield sets concept in the Tokyo Electron ECLIPSE-type machines requires minor modification to the plenum wall. As noted previously, slots 36 must be machined to enable the high vacuum pump on the plenum 11 to pump the process pods 10a.

Figure 3:
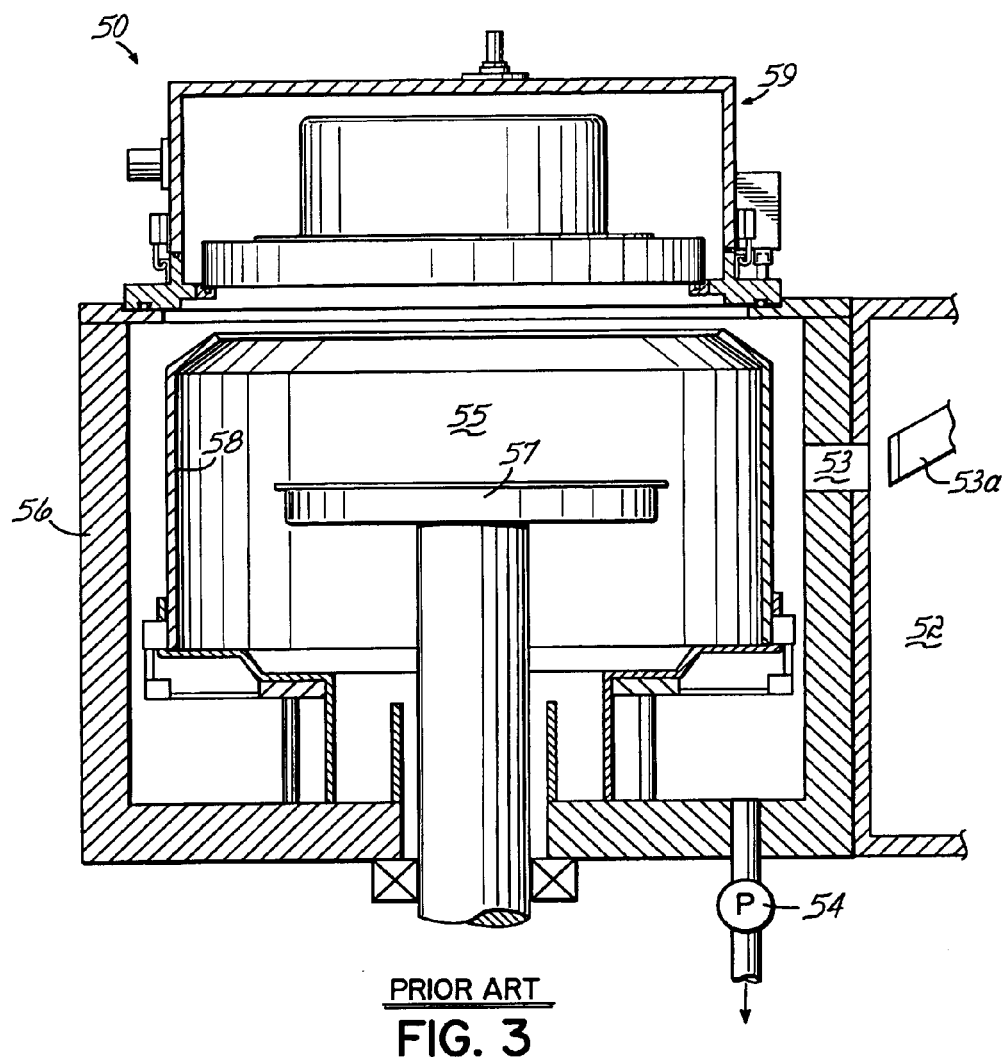
FIG. 3 is a cross-sectional view of a PVD processing module of a cluster tool of the prior art.

FIG. 3 is a cross section of a PVD module 50 of a type found on a cluster tool. The module 50 is attached to a transport chamber or module 52 in the configuration of the cluster tool, and a robot (not shown) loads and unloads wafers from the processing module 50 through a port 53. Usually, the PVD module 50 is isolated from the transport chamber 52 by a valve 53a at the port 53. The valve 53a is typically a rectangular gate valve often referred to as a slit valve. A dedicated high vacuum pump 54, usually a cryopump, pumps the module 50 to base pressure during wafer processing. This cryopump is, in turn, isolated from the module by a valve (not shown), most commonly a gate valve. The pump 54 maintains a vacuum in the processing chamber 55 during processing.

The processing chamber 55 is enclosed by a chamber wall 56 that contains an upwardly facing wafer support 57. A chamber shield assembly 58 protects the chamber wall from deposition from a PVD source 59 that faces downwardly from the top of the chamber 55. Processing gas is introduced into the chamber 55 through ports (not shown) that may be in the source 59 or the chamber wall 56.

Figure 4:
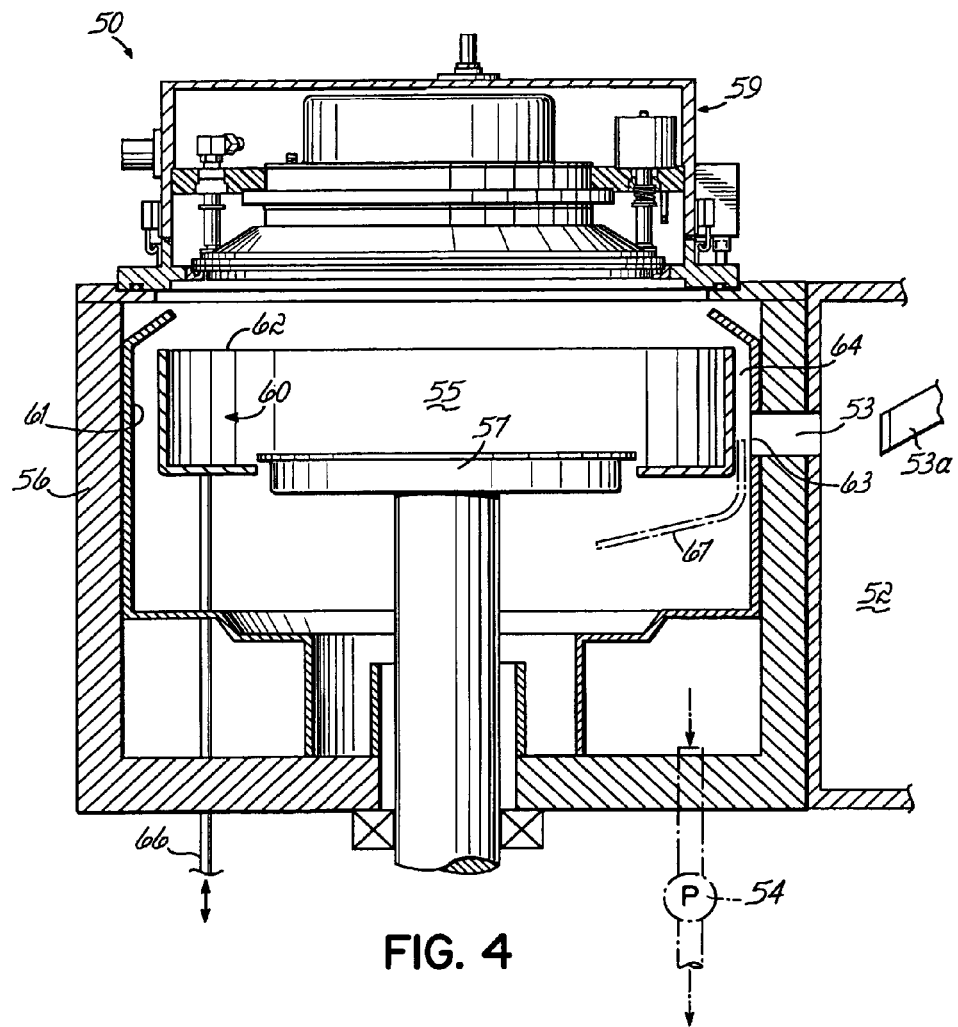
FIG. 4 is a cross-sectional view of a nested chamber shield installed in the apparatus of FIG. 3 according to an embodiment of the present invention.

Pumping the process module 50 through the transport module 52, according to the present invention, eliminates the need for a separate pump 54, as illustrated in FIG. 4. Similarly, isolation valves 53a at the gate 53 and at the pump 54 on the module 50 can be eliminated. A nested shield set 60 replaces the shield 58 and is designed so that an outer shield 61 forms a "skin" that conforms to the inside of the chamber wall 56 or is spaced closely from it. A slot 63 is formed in the outer shield 61 that aligns with the gate opening or slot 53 in the chamber wall 56 that is used by a robot (not shown) from the transfer chamber 52 to load and unload wafers to and from the support 57 through the slot 53.

For 200 mm diameter wafers and larger, the aperture gas flow conductance of such a slot 53 is sufficient to provide the pumping speed required for non-critical packaging applications by pumping the module 50 through the slot 53 with the pump of the transfer module 52. The shield set 60 includes an inner shield 62 that is designed so that an annular space 64 between the two nested shields 61 and 62 is sized to provide adequate gas flow conductance for pumping of the chamber 55 through the slots 63 and 53. The upper rim of the shield 62 also extends sufficiently past the slot 63 to ensure that metal atoms sputtered from the target of the source 59 must undergo at least three specular reflections before they can deposit on any unshielded region of the chamber wall 56 or inside the slot 53. Depending on the way that wafers are handled in the PVD module 50, the inner shield 62 may be constructed with a slot to allow placement of a wafer on the substrate holder 57 by the robot. Alternatively, the inner shield 62 can be mounted on actuators 66, as shown, that allow the shield 62 to be moved up and down to allow placement of the wafer on the substrate holder 57 by passing it over the top of the shield 62, and to position the shield 62 relative to the substrate holder 57, which is often vertically adjustable. In the most common "sputter down" case, the inner shield 62 is lowered for wafer load and unload to allow robot access to the substrate holder 57, and raised during processing to protect the unshielded surfaces of the slot 53 from deposition.

To add the nested shield set 60 to a generic cluster tool module 50 so that the module can be pumped by the pump of the transfer module 52, no modifications are necessary to the hardware of the module 50. The geometries of the shield set 60 and its position in relationship to the chamber walls 56 and control of the flow of injected gas into the chamber 55 allow for regulation of the pressure in the chamber 55, as with the chamber of the apparatus of FIG. 2 described above. Different processing pressures can be accommodated by locating a gas injection port on each of the individual process modules. If there was a need to run a high pressure process in one of the modules and to prevent back-streaming from the transfer chamber 52 to other modules running at lower processing pressures, the gas flow conductance of the shield sets 60 can be changed to accommodate this. Restricting the aperture conductance of the outer shield 61 can be achieved where it covers the slot 53, provided this can be done without interfering with the robot arm during wafer load and unload. Alternatively, the annular gap between the shields can be changed to adjust gas flow conductance, for example, it can be narrowed to reduce conductance to allow higher pressure in the chamber 55. This approach would employ different inner shields 62 for high and low pressure processes.

Another approach to reducing gas flow conductance is to mount a baffle shield 67 on the same actuator 66 that raises and lowers the inner shield 62. In the raised position of the actuator 66, the baffle shield 67 would cover the pumping slot 53, thus lowering its conductance to the desired value. The configuration and position of the baffle for best performance may be determined empirically.

To perform reactive sputtering in a cluster tool module 50 that is configured with a nested shield set 60, a separate pump 54 (FIG. 3) could be installed or reinstalled on the module 50, along with associated isolation valve. In addition, the isolation valve 53a that isolates the chamber 55 from the transfer module 52 would be reinstalled. No architectural modifications to the module 50 would be necessary. The outer shield 61 would be modified by forming a hole in the outer shield 61 to align with the cryopump, so as to allow pumping. The inner nested shield 62 could remain unchanged.

From the above description, it will be readily apparent to those skilled in the art that modifications and additions thereto can be made without departing from the principles of the present invention. The concepts can be modified and adapted for use in tool architectures of various manufacturers.

What is claimed is:

1. A method of maintaining processing pressure in a single-wafer vacuum processing chamber of a semiconductor wafer PVD processing machine having a plurality of processing chambers, and a common exhaust volume communicating with each of the chambers and a high vacuum pump, the method comprising:
   providing one of the chambers of the machine with a replaceable protective shield set configured to substantially protect, from deposition caused by a process in the chamber, the walls of the chamber and a gas flow conductance path that extends from the chamber to the exhaust volume, and the protective shield set configured to partially impede gas flow from the chamber through the gas flow conductance path to the exhaust volume such that the processing pressure of gas in the chamber is distinctly higher than the pressure in the exhaust volume.

2. The method of claim 1 further comprising:
   controlling the flow of processing gas into the chamber so as to maintain the processing pressure in the chamber.

3. The method of claim 1 further comprising:
   providing a controller programmed to control the processing of wafers in the chamber, including controlling the supply of processing gas into the chamber such that gas flows from the chamber, through the path and to the exhaust volume, and such that the processing pressure in the chamber is distinctly higher than the pressure in the exhaust volume.

4. The method of claim 1 wherein the chamber is a first one of the chambers and the method further comprises:
   controlling the flow of processing gas into the first one of the chambers and of processing gas into a second one of the chambers so as to maintain the processing pressure of gas in the first one of the chambers at a pressure that is distinctly higher than the pressure in the second one of the chambers and in the exhaust volume, and so that the pressure in the second one of the chambers is higher than the pressure in the exhaust volume.

5. The method of claim 4 further comprising:
   providing the second one of the chambers of the machine with a replaceable protective shield set configured to substantially protect, from deposition caused by a process in said second one of the chambers, the walls thereof and a gas flow conductance path that extends therefrom to the exhaust volume, and to partially impede gas flow from said second one of the chambers through its respective gas flow conductance path to the exhaust volume to a degree less than the gas flow is impeded through its respective path from said first one of the chambers to the exhaust volume, such that the processing pressure of gas in said second one of the chambers is distinctly higher than the pressure in the exhaust volume.

6. The method of claim 1 further comprising:
   providing the semiconductor wafer processing machine with a plurality of single-wafer processing chambers.

7. The method of claim 1 further comprising:
   providing each of at least two of the chambers with a gas flow conductance path to the exhaust volume, at least one of which chambers being provided with the replaceable protective shield set; and providing the controller programmed to control the processing of wafers in the chambers by controlling the supply of process gas into each of said two of the chambers such that gas flows from the chamber, through the respective path and to the exhaust volume, and such that a chamber that is provided with said shield set is maintained at a higher controlled processing pressure than another of said at least two chambers.

8. The method of claim 1 further comprising:
providing each of at least two of the chambers with a replaceable protective shield set configured to partially restrict the flow from the chamber through a gas flow conductance path to the exhaust volume;
one of said two chambers being configured for performance of a relatively high pressure process on a wafer therein and being provided with a shield set configured to provide relatively low gas flow conductance through its respective path, and the other of said two chambers being configured for the performance of a relatively low pressure process therein and being provided with a shield set configured to provide relatively high gas flow conductance through its respective path.

9. The method of claim 1 further comprising:
providing each of at least three of the chambers with a replaceable protective shield set configured to partially restrict the flow from the chamber through a gas flow conductance path to the exhaust volume;
a first one of said three chambers being configured for performance of a relatively high pressure process on a wafer therein and being provided with a first shield set configured to provide relatively low gas flow conductance through its respective path;
a second one of said three chambers being configured for the performance of a relatively low pressure process therein and being provided with a second shield set configured to provide relatively high gas flow conductance through its respective path;
a third one of said three chambers being provided with either the first or the second shield set; and
providing the controller programmed to control the processing of wafers in the chambers, including controlling the supply of process gas into each of said three chambers such that processing pressure in the first one of the chambers is distinctly higher than the processing pressure in the second of said chambers and the exhaust volume, the pressure in the third one of the chambers is distinctly different than in either the first or the second ones of the chambers and the pressures in the second and third one of the chambers are distinctly higher than the pressure in the exhaust volume.

10. The method of claim 1 further comprising:
providing each of at least two of the chambers with a gas flow conductance path to the exhaust volume;
providing each of said at least two of the chambers with a replaceable protective shield set configured to substantially protect walls of the chamber and the gas flow conductance path from deposition from the chamber, and to partially impede the gas flow from the respective chamber through the respective gas flow conductance path to the exhaust volume; and
providing a controller programmed to control the processing of wafers in the chambers by controlling the supply of process gas into each of said two of the chambers such that gas flows from the chamber, through the respective path and to the exhaust volume, and such that each chamber is maintained at a different controlled processing pressure that is higher than the pressure at the exhaust volume.

11. The method of claim 1 further comprising:
providing each of at least two of the chambers with a gas flow conductance path to the exhaust volume;
providing each of said at least two of the chambers with a replaceable protective shield set configured to substantially protect walls of the chamber and the gas flow conductance path from deposition from the chamber, and to partially impede the gas flow from the respective chamber through the respective gas flow conductance path to the exhaust volume, the shield set of the at least two chambers being differently configured to differently impede the gas flow from the respective chamber.

12. The method of claim 1 wherein:
the providing of the protective shield set includes providing a nested set of shields including an outer shield adjacent the walls of the chamber and having an opening therethrough communicating with the gas flow conductance path, and an inner shield spaced from the outer shield so as to form an annular gap between the inner and outer shields that communicates with the opening, the gap and the opening forming a passage from the chamber to the gas flow conductance path.

13. The method of claim 1 wherein:
the providing of the protective shield set includes providing a nested set of shields that includes an outer shield adjacent the walls of the chamber that provides line-of-sight protection of walls of the chamber from deposition from the chamber and having an opening therethrough communicating with the gas flow conductance path, and an inner shield spaced from the outer shield so as to form an annular gap between the inner and outer shields that communicates with the opening and so as to require at least three specular reflections off shield surfaces of atoms of coating material moving from the chamber to the opening.

14. The method of claim 1 further comprising:
injecting a flow of processing gas into said chamber through a hole in the shield set.

15. The method of claim 1 further comprising:
injecting a flow of processing gas into said chamber through a hole in the shield set; and
sensing pressure in said chamber through a hole in the shield set.

16. The method of claim 1 wherein the replaceable protective shield set comprises:
an outer shield having a generally cylindrical portion and a gas outlet opening therethrough and a gas inlet opening therethrough;
an inner shield having a generally cylindrical portion of a diameter less than that of the generally cylindrical portion of the outer shield and having an inlet opening therethrough for alignment with the inlet opening of the outer shield; and
the inner shield being configured to mount in a nested relationship with the outer shield so as to form an annular gap between the inner and outer shields that communicates with the outlet opening and that extends sufficiently from the outlet opening so as to require at least three specular reflections off shield surfaces of atoms of coating material moving from the chamber to the outlet opening when the shield set is installed in a process chamber and a PVD process is being performed in the process chamber.

* * * * *